US012641946B2

(12) United States Patent
Lee et al.

(10) Patent No.: US 12,641,946 B2
(45) Date of Patent: May 26, 2026

(54) ELECTROLUMINESCENT DEVICE, METHOD OF MANUFACTURING THE SAME, AND DISPLAY DEVICE INCLUDING THE SAME

(71) Applicant: SAMSUNG ELECTRONICS CO., LTD., Suwon-si (KR)

(72) Inventors: Heejae Lee, Suwon-si (KR); Tae Ho Kim, Suwon-si (KR); Jun-Mo Yoo, Suwon-si (KR); Ilyoung Lee, Suwon-si (KR); Shin Ae Jun, Suwon-si (KR); Dae Young Chung, Suwon-si (KR); Moon Gyu Han, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 447 days.

(21) Appl. No.: 18/368,010

(22) Filed: Sep. 13, 2023

(65) Prior Publication Data

US 2024/0099045 A1 Mar. 21, 2024

(30) Foreign Application Priority Data

Sep. 14, 2022 (KR) ........................ 10-2022-0115812

(51) Int. Cl.
*H10K 50/115* (2023.01)
*H10K 50/828* (2023.01)
(Continued)

(52) U.S. Cl.
CPC ......... *H10K 50/115* (2023.02); *H10K 50/828* (2023.02); *H10K 71/12* (2023.02); *H10K 2102/351* (2023.02)

(58) Field of Classification Search
CPC .... H10K 50/115; H10K 50/828; H10K 71/12; H10K 2102/351
See application file for complete search history.

(56) References Cited

U.S. PATENT DOCUMENTS 9,252,196 B2  2/2016  Kim et al.
9,905,617 B2  2/2018  Seo et al.
(Continued)

FOREIGN PATENT DOCUMENTS

KR  1020130027302  3/2013
KR  1020140077019  6/2014
(Continued)

*Primary Examiner* — Anne M Hines
(74) *Attorney, Agent, or Firm* — CANTOR COLBURN LLP

(57) ABSTRACT

Provided are an electroluminescent device, a method of manufacturing the same, and a display device including the same, the electroluminescent device including a first electron auxiliary layer, a first light emitting layer, and a first electrode disposed on a first surface of a transparent electrode; and a second electron auxiliary layer, a second light emitting layer, and a second electrode disposed on a second surface of the transparent electrode, wherein the first electron auxiliary layer and the second electron auxiliary layer each include a plurality of zinc oxide nanoparticles, a ratio $(t_1/t_0)$ of a thickness $(t_1)$ of the first electron auxiliary layer to a thickness $(t_0)$ of the transparent electrode and a ratio $(t_2/t_0)$ of a thickness $(t_2)$ of the second electron auxiliary layer to the thickness $(t_0)$ of the transparent electrode are each in the range of about 0.1 to about 4.0.

17 Claims, 1 Drawing Sheet

100

(51) Int. Cl.
 *H10K 71/12* (2023.01)
 *H10K 102/00* (2023.01)

(56) References Cited

U.S. PATENT DOCUMENTS

| | | | |
|---|---|---|---|
| 10,199,436 B2 | 2/2019 | Seo et al. | |
| 10,573,693 B2 | 2/2020 | Seo et al. | |
| 11,387,280 B2 | 7/2022 | Seo et al. | |
| 2008/0199669 A1* | 8/2008 | Lee ........................ | B82Y 20/00 |
| | | | 428/407 |
| 2014/0167626 A1 | 6/2014 | Kim et al. | |
| 2017/0338289 A1 | 11/2017 | Seo et al. | |
| 2018/0190727 A1 | 7/2018 | Seo et al. | |
| 2019/0229158 A1 | 7/2019 | Seo et al. | |
| 2020/0258948 A1 | 8/2020 | Seo et al. | |
| 2021/0126218 A1* | 4/2021 | Kim ........................ | H10K 50/15 |
| 2022/0195300 A1* | 6/2022 | Nakata ..................... | G09F 9/33 |
| 2022/0344313 A1 | 10/2022 | Li et al. | |
| 2023/0037604 A1 | 2/2023 | Chae et al. | |

FOREIGN PATENT DOCUMENTS

| | | |
|---|---|---|
| KR | 1020210014398 | 2/2021 |
| KR | 1020220024710 | 3/2022 |
| KR | 1020220031867 | 3/2022 |
| KR | 102389536 | 4/2022 |
| KR | 1020220048467 | 4/2022 |

* cited by examiner

ELECTROLUMINESCENT DEVICE, METHOD OF MANUFACTURING THE SAME, AND DISPLAY DEVICE INCLUDING THE SAME

CROSS-REFERENCE TO RELATED APPLICATION

This application claims priority to Korean Patent Application No. 10-2022-0115812 filed on Sep. 14, 2022, and all the benefits accruing therefrom under 35 U.S.C. § 119, the content of which in its entirety is herein incorporated by reference.

BACKGROUND

(a) Field

The present disclosure relates to an electroluminescent device, a method of manufacturing the same, and a display device including the same.

(b) Description of the Related Art

Semiconductor particles (e.g., semiconductor nanoparticles) having a nanometer size may exhibit luminescence properties. For example, the semiconductor nanoparticles can exhibit quantum confinement effects. Light emission from the semiconductor nanoparticles may occur when an electron in an excited state transitions from a conduction band to a valence band as a result of light excitation or due to an applied voltage. The semiconductor nanoparticle may be configured to emit light of a desired wavelength region by adjusting its size, composition, or a combination thereof.

Semiconductor nanoparticles may be used in an electroluminescent device and a display device including the same due to improved color purity and color reproducibility.

However, improvements in the efficiency and life-span of the device are continuously desired.

SUMMARY

An embodiment provides an electroluminescent device that includes semiconductor nanoparticles and has excellent color purity and color reproducibility as well as excellent efficiency and life-span characteristics.

Another embodiment provides a method of manufacturing the electroluminescent device.

Another embodiment provides a display device that includes the electroluminescent device.

In an embodiment, an electroluminescent device includes a first electron auxiliary layer, a first light emitting layer, and a first electrode disposed on a first surface of a transparent electrode; and a second electron auxiliary layer, a second light emitting layer, and a second electrode disposed on a second surface of the transparent electrode, where the second surface is opposed to the first surface;

wherein each of the first electron auxiliary layer and the second electron auxiliary layer include a plurality of zinc oxide nanoparticles, a ratio ($t_1/t_0$) of a thickness ($t_1$) of the first electron auxiliary layer to a thickness ($t_0$) of the transparent electrode and a ratio ($t_2/t_0$) of a thickness ($t_2$) of the second electron auxiliary layer to the thickness ($t_0$) of the transparent electrode are each in the range of about 0.1 to about 4.0, and each of the first light emitting layer and the second light emitting layer includes a plurality of semiconductor nanoparticles.

The transparent electrode may have a transmittance of greater than or equal to about 90%.

The transparent electrode may be formed in a pattern and may be formed in a direction orthogonal to the patterns of the first electrode and the second electrode.

The zinc oxide nanoparticles may further include an additional metal selected from Mg, Ca, Zr, W, Li, Ti, Y, Al, or a combination thereof.

The zinc oxide nanoparticles may be of a formula $Zn_{1-x}M_xO$ wherein, M is Mg, Ca, Zr, W, Li, Ti, Y, Al, or a combination thereof, and $0 \le x \le 0.5$.

An average size of the zinc oxide nanoparticles may be about 1 nanometers (nm) to about 10 nm.

A thickness of each of the first electron transport layer and the second electron transport layer may be in a range of about 10 nm to about 90 nm.

The first light emitting layer and the second light emitting layer may include the same or different semiconductor nanoparticles.

The plurality of semiconductor nanoparticles may not contain cadmium, lead, mercury, or a combination thereof.

The plurality of semiconductor nanoparticles may include a first semiconductor nanocrystal containing zinc, selenium, and tellurium, and a second semiconductor nanocrystal containing zinc chalcogenide; where the second semiconductor nanocrystal is different from the first semiconductor nanocrystal.

The plurality of semiconductor nanoparticles may include a first semiconductor nanocrystal containing indium, phosphorus, and, optionally, zinc, and a second semiconductor nanocrystal containing zinc chalcogenide; where the second semiconductor nanocrystal is different from the first semiconductor nanocrystal.

An average size of the plurality of semiconductor nanoparticles may be about 4 nm to about 30 nm.

The plurality of semiconductor nanoparticles may include a core including the first semiconductor nanocrystal and a shell disposed on the core and including the second semiconductor nanocrystal.

The first electron transport layer may be adjacent to the first light emitting layer (e.g., directly on the first light emitting layer), and the second electron transport layer is adjacent to the second light emitting layer (e.g., directly on the second light emitting layer).

The electroluminescent device may further include a first hole auxiliary layer between the first light emitting layer and the first electrode, and further include a second hole auxiliary layer between the second light emitting layer and the second electrode.

In another embodiment, a method of manufacturing the electroluminescent device includes coating a dispersion containing zinc oxide nanoparticles on a first surface of a transparent electrode and then drying to form a first electron auxiliary layer, and coating a composition containing semiconductor nanoparticles on the first electron auxiliary layer and then drying to form a first light emitting layer, coating a dispersion containing zinc oxide nanoparticles on a second surface of the transparent electrode and then drying to form a second electron auxiliary layer, and coating a composition containing semiconductor nanoparticles on the second electron auxiliary layer and then drying to form a second light emitting layer, where the first surface of the transparent electrode is opposed to the second surface; and forming a first electrode on the first light emitting layer and forming a second electrode on the second light emitting layer.

Another embodiment provides a display device includes the aforementioned electroluminescent device.

The display device may include a portable terminal device, a monitor, a laptop computer, a television, an electronic display board, a camera, or an electric component.

The electroluminescent device may exhibit improved external quantum efficiency and life-span characteristics and may solve deterioration problems at interfaces between the first light emitting layer and the first electron auxiliary layer and between the second light emitting layer and the second electron auxiliary layer.

DETAILED DESCRIPTION

Figure 1:
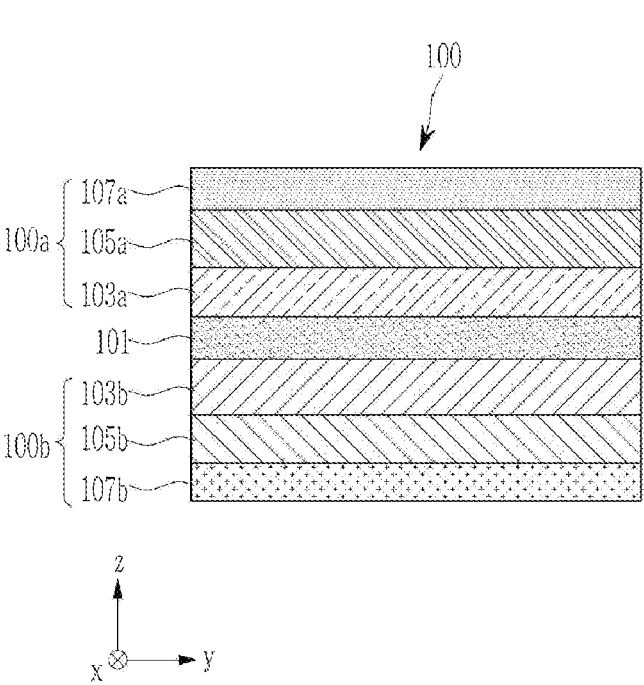
FIG. 1 is a schematic cross-sectional view of an electroluminescent device according to an embodiment.

Advantages and characteristics of this disclosure, and a method for achieving the same, will become evident referring to the following exemplary embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification.

The size and thickness of each constituent element as shown in the drawings are randomly indicated for better understanding and ease of description, and this disclosure is not necessarily limited to the embodiments depicted in the drawings. In the drawings, the thickness of layers, films, panels, regions, etc., are exaggerated for clarity. And in the drawings, for convenience of description, the thickness of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "Or" means "and/or."

As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In addition, in this specification, the phrase "on a plane" means viewing a target portion from the top, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Further, the singular includes the plural unless mentioned otherwise.

Hereinafter, values of a work function, a conduction band, or a lowest unoccupied molecular orbital (LUMO) (or valence band or HOMO) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

As used herein, the term "Group" may refer to a group of Periodic Table. As used herein, "Group II" refers to Group IIA and Group IIB, and examples of Group II metal may be Cd, Zn, Hg, and Mg, but are not limited thereto. As used herein, "Group III" refers to Group IIIA and Group IIIB, and examples of Group IIIA metal may be Al, In, Ga, and Tl, and examples of Group IIIB may be scandium, yttrium, or the like, but are not limited thereto. As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto. As used herein, "metal" includes a semi-metal such as Si. As used herein, "Group V" includes Group VA and includes nitrogen, phosphorus, arsenic, antimony, and bismuth, but is not limited thereto. As used herein, "Group VI" includes Group VIA and includes sulfur, selenium, and tellurium, but is not limited thereto. As used herein, the average (value) may be mean or median. In an embodiment, the average (value) may be a mean average.

As used herein, when a definition is not otherwise provided, "substituted" refers to replacement of at least one hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other toxic heavy toxic metal) may be present or, if present, an amount of cadmium (or other heavy metal) may be less than or equal to a detection limit or as an impurity level of a given analysis tool (e.g., an inductively coupled plasma atomic emission spectroscopy).

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, ±5%, ±3%, or ±1% of the stated value.

Semiconductor nanoparticles such as quantum dots may exhibit quantum confinement or exciton confinement. In this specification, the term nanoparticle or quantum dot is not limited in its shape unless specifically defined. The semiconductor nanoparticles may have a size smaller than the diameter of the Bohr excitation in the bulk crystal of the same material and may exhibit a quantum confinement effect. The quantum dots may emit light corresponding to their bandgap energy by controlling the size of the emission center of the nanocrystals.

As used herein, the wording "external quantum efficiency (EQE)" is a ratio of the number of photons emitted from a light emitting diode (LED) to the number of electrons passing through the device and can be a measurement as to how efficiently a given device converts electrons to photons and allows them to make an escape. The EQE can be determined by the following equation:

$$EQE = \text{an efficiency of injection} \times \text{a (solid-state) quantum yield} \times \text{an efficiency of extraction}$$

wherein the efficiency of injection is a proportion of electrons passing through the device that are injected into the active region;

the quantum yield is a proportion of all electron-hole recombination in the active region that are radiative and produce photons; and the efficiency of extraction is a proportion of photons generated in the active region that escape from the given device.

As used herein, a maximum EQE is a greatest value of the EQE.

As used herein, a maximum luminance is a greatest value of the luminance a given device can achieve.

As used herein, the wording quantum efficiency may be used interchangeably with a quantum yield. In an embodiment, the quantum efficiency may be a relative quantum yield or an absolute quantum yield, for example, which can be readily measured by any suitable, e.g., commercially available, equipment. The quantum efficiency (or quantum yield) may be measured in a solution state or a solid state (in a composite)

In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as a standard dye, depending on the PL wavelengths thereof, but are not limited thereto.

Unless mentioned otherwise, a numerical range recited herein includes any real number within the endpoints of the stated range and includes the endpoints thereof A bandgap energy of a semiconductor nanoparticle may vary with a size and a composition of a nanocrystal. For example, as a size of the semiconductor nanoparticle increases, the bandgap energy of the semiconductor nanoparticle may narrow, e.g., decrease, and the semiconductor nanoparticle may emit light of an increased emission wavelength. A semiconductor nanocrystal may be used as a light emitting material in various fields such as a display device, an energy device, or a bio light emitting device.

A quantum dot electroluminescent device (hereinafter, also referred to as QD-LED) may emit light by applying a voltage and includes a semiconductor nanoparticle as a light emitting material. A QD-LED uses a different emission principle from an organic light emitting diode (OLED) using organic materials and realizes, e.g., displays, more pure colors (red, green, blue) and improved color reproducibility thereby attracting attention as a next generation display device. A method of producing the QD-LED may include a solution process, which may lower, e.g., reduce, a manufacturing cost. In addition, the semiconductor nanoparticles in the QD-LED is based on an inorganic material, contributing to realization of an increased stability. It is still desired to develop a technology that improves efficiency and a life-span of a device.

Semiconductor nanoparticles exhibiting a desirable electroluminescent property may contain a harmful heavy metal such as cadmium (Cd), lead, mercury, or a combination thereof.

Accordingly, it is desirable to provide an electroluminescent device or a display device having a light emitting layer substantially free of harmful heavy metals.

In the present specification, "average size" may be an average particle diameter in the case of a circular shape and may be a length of a major axis in the case of a shape other than a circular shape. The "average size" may be measured by a method well known to those skilled in the art, for example, may be measured by a particle size analyzer, or may be measured by a transmission electron microscope photograph or a scanning electron microscope photograph. Alternatively, it is possible to obtain an average particle diameter value by measuring a size using a dynamic light scattering method, performing data analysis, counting the number of particles for each particle size range, and calculating the average particle size from this. Unless otherwise defined, the average size (average particle diameter) may mean the diameter (D50) of particles having a cumulative volume of 50 volume % in a particle size distribution as measured by a particle size analyzer.

Hereinafter, "combination" includes a mixture of two or more, an alloy of two or more, inter-substitution, and a stacked structure of two or more.

As used herein, "at least one of A, B, or C," "one of A, B, C, or a combination thereof" and "one of A, B, C, and a combination thereof" refer to each constituent element, and a combination thereof (e.g., A; B; C; A and B; A and C; B and C; or A, B and C).

In this specification, the terms "lower" and "upper" are for convenience of description only and do not limit the positional relationship.

In an embodiment, an electroluminescent device may be a luminescent type of electroluminescent device configured to emit a desired light by applying a voltage.

A light emitting device having a multi-layered structure has been reported in order to improve the life-span of a luminescent type light emitting device. The light emitting device of the multi-layered structure includes a multi-layered light emitting structure including a plurality of light emitting layers and a multi-layered LED structure including a plurality of light emitting devices. The multi-layered light emitting structure is a structure in which a plurality of light emitting layers of red-green-blue (RGB) or red-blue (RB) are stacked, and it is possible to manufacture a high-efficiency device, but has a disadvantage in that the manufacturing process is complicated and a color coordinate change occurs. In addition, the multi-layered LED structure can provide a device with high current efficiency and long life-span but has a disadvantage in that it has a complicated manufacturing process and a high driving voltage due to high device resistance.

The multi-layered light emitting structure and the multi-layered LED device may be expected to have improved life-span through improved efficiency, but at the same time, life-span due to a high driving voltage caused by an increase in device resistance may be decreased. In addition, the manufacturing process may be complicated due to the large number of layers stacked in the deposition process. Additionally, when LED devices are connected in series, even if only one layer of the light emitting layers constituting the device is degraded, it can have a fatal effect on device characteristics.

Therefore, in an embodiment, a transparent electrode is disposed at the center as a cathode for injecting electrons, and an upper electrode and a lower electrode are disposed as anodes for injecting holes to provide an electroluminescent device having a parallel connection structure.

Hereinafter, an EL device according to an embodiment will be described with reference to FIG. 1.

FIG. 1 is a schematic cross-sectional view of an electroluminescent device according to an embodiment.

Referring to FIG. 1, an electroluminescent device 100 includes a first unit device 100a including a first electron auxiliary layer 103a, a first light emitting layer 105a, and a first electrode 107a disposed on one surface of a transparent electrode 101; and a second unit device 100b including a second electron auxiliary layer 103b, a second light emitting layer 105b, and a second electrode 107b disposed on the other surface of the transparent electrode 101, wherein each of the first electron auxiliary layer 103a and the second electron auxiliary layer 103b include a plurality of zinc oxide nanoparticles, wherein a ratio $(t_1/t_0)$ of a thickness $(t_1)$ of the first electron auxiliary layer 103a to a thickness $(t_0)$ of the transparent electrode 101 and a ratio $(t_2/t_0)$ of a thickness $(t_2)$ of the second electron auxiliary layer 103b to the thickness $(t_0)$ of the transparent electrode 101 are each in the range of about 0.1 to about 4.0, and each of the first light emitting layer 105a and the second light emitting layer 105b includes a plurality of semiconductor nanoparticles.

The electroluminescent device 100 having the above structure includes the first unit device 100a including the first electron auxiliary layer 103a, the first light emitting layer 105a, and the first electrode 107a, and the second unit device 100b including the second electron auxiliary layer 103b, the second light emitting layer 105b, and the second electrode 107b, wherein the first unit device 100a and the second unit device 100b are connected in parallel to each other to reduce resistance and driving voltage, and improve luminous efficiency and life-span of the device. The first unit device 100a is disposed on a first surface of the transparent electrode 101, while the second unit device 100b is disposed on a second surface of the transparent electrode 101. The first surface is opposed to the second surface.

The transparent electrode 101 may have a light transmittance of greater than or equal to about 90%, greater than or equal to about 95%, or greater than or equal to about 99% and less than or equal to about 100%. Efficiency of the electroluminescent device can be improved within the above range.

The transparent electrode 101 may include Mg:Ag, Al, PEDOT:PSS (poly(3,4-ethylenedioxythiophene) polystyrene sulfonate, for example PH1000 manufactured by Clevios), or a combination thereof. Mg and Ag may be present in Mg:Ag in a weight ratio of, for example, about 0.5:1 to about 1.5:1. Light transmittance can be easily adjusted within the above range.

A thickness of the transparent electrode 101 may be appropriately selected in consideration of the thickness ratio between the first electron auxiliary layer 103a and the second electron auxiliary layer 103b and the light transmittance of the transparent electrode 101. For example, the thickness of the transparent electrode 101 may be greater than or equal to about 1 nm, for example greater than or equal to about 2 nm, greater than or equal to about 3 nm, greater than or equal to about 4 nm, or greater than or equal to about 5 nm and less than or equal to about 12 nm, less than or equal to about 11 nm, or less than or equal to about 10 nm.

The transparent electrode 101 may be used as a cathode.

The transparent electrode 101 may be formed in a pattern and may be formed in a direction orthogonal to patterns of the first electrode 107a and the second electrode 107b which will be described later. According to this structure, the first electrode 107a and the second electrode 107b have the same potential value, and an electric field is formed due to a potential difference with the transparent electrode 101. Thereby, the same charges (either holes or electrons) may be injected into the first electrode 107a and the second electrode 107b, and different charges (either electrons or holes) from the charges that are injected into the first electrode 107a and the second electrode 107b may be injected into the transparent electrode 101.

A first electron auxiliary layer 103a is formed on one surface (the first surface) of the transparent electrode 101 and a second electron auxiliary layer 103b is formed on the second surface. As noted above, the second surface is opposed to the first surface.

The first electron auxiliary layer 103a and the second electron auxiliary layer 103b may be formed adjacent to (directly on) the transparent electrode 101.

The first electron auxiliary layer 103a and the second electron auxiliary layer 103b each include a plurality of zinc oxide nanoparticles.

The zinc oxide nanoparticles may be zinc oxide (ZnO) nanoparticles and may further include an additional metal selected from Mg, Ca, Zr, W, Li, Ti, Y, Al, or a combination thereof.

The zinc oxide nanoparticles may include a compound represented by formula $Zn_{1-x}M_xO$, where M is Mg, Ca, Zr, W, Li, Ti, Y, Al, or a combination thereof, and $0 \leq x \leq 0.5$. In the above chemical formula, the x may be greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. The x may be less than or equal to about 0.47, less than or equal to about 0.45, less than or equal to about 0.43, less than or equal to about 0.40, less than or equal to about 0.37, less than or equal to about 0.35, or less than or equal to about 0.3.

An average size of the zinc oxide nanoparticles may be greater than or equal to about 1 nm, for example, greater than or equal to about 2 nm, greater than or equal to about 3 nm, greater than or equal to about 5 nm or greater than or equal to about 6 nm. The average size of the zinc oxide nanoparticles may be less than or equal to about 10 nm, for example, less than or equal to about 8 nm, or less than or equal to about 7 nm. The thicknesses of the first electron auxiliary layer 103a and the second electron auxiliary layer 103b may be easily adjusted within the above range.

The first electron auxiliary layer 103a and the second electron auxiliary layer 103b may each have a thickness of greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, or greater than or equal to about 18 nm. The first electron auxiliary layer 103a and the second electron auxiliary layer 103b may each have a thickness of less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, less than or equal to about 35 nm, less than or equal to about 30 nm, or less than or equal to about 25 nm.

A ratio $(t_1/t_0)$ of a thickness $(t_1)$ of the first electron auxiliary layer 103a to a thickness $(t_0)$ of the transparent electrode 101 and a ratio $(t_2/t_0)$ of a thickness $(t_2)$ of the second electron auxiliary layer 103b to the thickness $(t_0)$ of the transparent electrode 101 are each in the range of about 0.1 to about 4.0. For example, the thickness ratios $(t_1/t_0$ and $t_2/t_0)$ may be greater than or equal to about 0.2, greater than or equal to about 0.3, greater than or equal to about 0.4, greater than or equal to about 0.5, greater than or equal to about 0.6, greater than or equal to about 0.7, greater than or equal to about 0.8, greater than or equal to about 0.9, or greater than or equal to about 1.0. The thickness ratios $(t_1/t_0$ and $t_2/t_0)$ may be less than or equal to about 3.9, less than or equal to about 3.8, less than or equal to about 3.7, less than or equal to about 3.6, less than or equal to about 3.5, less than or equal to about 3.4, less than or equal to about 3.3, less than or equal to about 3.2, less than or equal to about 3.1, less than or equal to about 3.0, less than or equal to about 2.9, less than or equal to about 2.8, less than or equal to about 2.7, less than or equal to about 2.6, less than or equal to about 2.5, less than or equal to about 2.4, less than or equal to about 2.3, less than or equal to about 2.2, less than or equal to about 2.1, or less than or equal to about 2.0. In an embodiment, the thickness ratios $(t_1/t_0$ and $t_2/t_0)$ may each be in the range of about 0.2 to about 4.0 or about 0.4 to about 4.0. Within the above range, a transmittance of an electrode structure may be adjusted appropriately to improve the efficiency and life-span of the electroluminescent device, while maintaining improved conductivity.

In an embodiment, as included in an electron only device (EOD), the first electron auxiliary layer 103a and second electron auxiliary layer 103b may exhibit a relatively low level of a photocurrent density-voltage (JV) hysteresis in a J-V scan experiment wherein a current density is measured as a function of an applied voltage that is changed in a predetermined range (e.g., from 0 volt to about 8 volts). Without wishing to be bound by any theory, the JV hysteresis may be related with the presence of the defects included in a given electron transport layer (any one of the first electron auxiliary layer 103a and the second electron auxiliary layer 103b). The EOD including the electron transport layer (any one of the first electron auxiliary layer 103a and the second electron auxiliary layer 103b) according to an embodiment may exhibit a hysteresis of less than or equal to about 60%, less than or equal to about 55%, less than or equal to about 52%, less than or equal to about 51%, and greater than or equal to about and 1%, greater than or equal to about 10%, greater than or equal to about 15%, or greater than or equal to about 20%, at a first sweep.

The JV hysteresis may be determined by Equation 1.

$$[(A2-A1)/A2] \times 100(\%) \qquad \text{[Equation 1]}$$

In Equation 1, A1 is a largest rectangle area in a forward scan in a given JV graph and A2 is a largest rectangle area in a backward scan in a given JV graph.

The first light emitting layer 105a and the second light emitting layer 105b are formed on the first electron auxiliary layer 103a and the second electron auxiliary layer 103b, respectively.

The first light emitting layer 105a and the second light emitting layer 105b include semiconductor nanoparticle(s) (e.g., blue light emitting nanoparticles, red light emitting nanoparticles, or green light emitting nanoparticles).

The first light emitting layer 105a and the second light emitting layer 105b may include the same or different semiconductor nanoparticle(s) according to the electroluminescent device to be implemented.

The first light emitting layer 105a and the second light emitting layer 105b may include one or more (e.g., 2 or more or 3 or more and 10 or less) monolayers of a plurality of nanoparticles.

The first light emitting layer 105a and the second light emitting layer 105b may be patterned. In an embodiment, the patterned first light emitting layer 105a and second light emitting layer 105b may include, for example a blue light emitting layer disposed in the blue pixel in a display device described later, for example, a red light emitting layer disposed in the red pixel in a display device described later, for example, a green light emitting layer in the green pixel in a display device described later, or a combination thereof. Each of the (e.g., red, green, or blue) light emitting layers may be (e.g., optically) separated from an adjacent light emitting layer by a partition wall. In an embodiment, partition walls such as black matrices may be disposed between the red light emitting layer(s), the green light emitting layer(s), and the blue light emitting layer(s). The red light emitting layer, the green light emitting layer, and the blue light emitting layer may be optically isolated from each other.

The semiconductor nanoparticles may have a core-shell structure. In an embodiment, the semiconductor nanoparticle(s) or the core-shell structure may include a core including a first semiconductor nanocrystal and a shell including a second semiconductor nanocrystal disposed on the core and having a composition different from that of the first semiconductor nanocrystal.

The semiconductor nanoparticle(s) (or the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group II-III-VI compound, a Group I-II-IV-VI compound, or a combination thereof. The first light emitting layer 105a and second light emitting layer 105b or the semiconductor nanoparticle (e.g., the first semiconductor nanocrystal or the second semiconductor nanocrystal) may not include cadmium. The first light emitting layer 105a and second light emitting layer 105b or the semiconductor nanoparticle (e.g., the first semiconductor nanocrystal or the second semiconductor nanocrystal) may not include lead, or a combination thereof.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal. An example of such a semiconductor nanocrystal is InZnP.

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group I-III-VI compound may be $CuInSe_2$, $CuInS_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single-element compound such as Si, Ge, or a combination thereof; a binary element compound such as SiC, SiGe, or a combination thereof; or a combination thereof.

In an embodiment, the semiconductor nanoparticle or the first semiconductor nanocrystal may include a metal including indium, zinc, or a combination thereof and a non-metal including phosphorus, selenium, tellurium, sulfur, or a combination thereof. The first semiconductor nanocrystal may be a light emitting center.

In an embodiment, the second semiconductor nanocrystal may include a metal including indium, zinc, or a combination thereof, and a non-metal including phosphorus, selenium, tellurium, sulfur, or a combination thereof.

In an embodiment, a first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof. In an embodiment, the shell or the second semiconductor nanocrystal may include a zinc chalcogenide. The second semiconductor nanocrystal is different from the first semiconductor nanocrystal. The zinc chalcogenide may include zinc; and a chalcogen element (e.g., selenium, sulfur, tellurium, or a combination thereof). In an embodiment, the shell may include zinc, sulfur, and optionally selenium in the outermost layer.

In an embodiment, the semiconductor nanoparticle(s) may emit blue or green light and may include a core including ZnSeTe, ZnSe, or a combination thereof and a shell including a zinc chalcogenide (e.g., ZnS, ZnSe, and/or ZnSeS). An amount of sulfur in the shell may increase or decrease in a radial direction (from the core toward the surface), e.g., the amount of sulfur may have a concentration gradient wherein the concentration of sulfur varies radially (e.g., decreases or increases toward the core).

In an embodiment, the semiconductor nanoparticle may emit red or green light, the core may include InP, InZnP, or a combination thereof, and the shell may include a Group II metal including zinc and a non-metal including sulfur, selenium, or a combination thereof.

In an embodiment, as the semiconductor nanoparticle has a core-shell structure, on the interface between the core and the shell, an alloyed interlayer may be present or may not be present. The alloyed layer may include a homogeneous alloy or may have a concentration gradient. The gradient alloy may have a concentration gradient wherein the concentration of an element of the shell varies radially (e.g., decreases or increases toward the core).

In an embodiment, the shell may have a composition that varies in a radial direction. In an embodiment, the shell may be a multi-layered shell including two or more layers. In the multi-layered shell, two adjacent layers may have different compositions from each other. In the multi-layered shell, a, e.g., at least one, layer may independently include a semiconductor nanocrystal having a single composition. In the multi-layered shell, a, e.g., at least one, layer may independently have an alloyed semiconductor nanocrystal. In the multi-layered shell, a, e.g., at least one, layer may have a concentration gradient that varies radially in terms of a composition of a semiconductor nanocrystal.

In the semiconductor nanoparticle having a core-shell structure, a shell material may have a bandgap energy that is larger, e.g., greater, than that of the core, but it is not limited thereto. The materials of the shell may have a bandgap energy that is smaller, e.g., less, than that of the core. In the case of the multi-layered shell, the bandgap energy of the outermost layer material of the shell may be greater than the bandgap energies of the core and the inner layer material of the shell (layers that are closer to the core). In the case of the multi-layered shell, a semiconductor nanocrystal of each layer is selected to have an appropriate bandgap, thereby effectively showing, e.g., exhibiting, a quantum confinement effect.

The semiconductor nanoparticle according to an embodiment may include, for example, an organic ligand which is bonded or coordinated to a surface thereof. The organic ligand may help the semiconductor nanoparticles be dispersed in a solution. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof. Herein, R and R' is each independently a substituted or unsubstituted, C3 or greater, C6 or greater, C10 or greater—about C40 or less, C35 or less, C25 or less, aliphatic hydrocarbon group (e.g., alkyl, alkenyl, alkynyl, or the like), a substituted or unsubstituted C6 to C40 aromatic hydrocarbon group (e.g., aryl group), or a combination thereof. The organic ligand may be used alone or as a mixture of at least two compounds.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine compound such as methyl amine, ethyl amine, propyl amine, butyl amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide, and the like; a diphenyl phosphine compound, a triphenyl phosphine compound, or an oxide compound thereof; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid, and the like; a C5 to C20 alkyl phosphonic acid; and the like, but are not limited thereto.

An absorption/emission wavelength of the semiconductor nanoparticle may be controlled by adjusting the compositions, sizes, or a combination thereof of the semiconductor nanoparticles. The semiconductor nanoparticles included in the first light emitting layer 105a and second light emitting layer 105b may be configured to emit light of a desired color. The semiconductor nanoparticles may include blue light emitting semiconductor nanoparticles, green light emitting semiconductor nanoparticles, or red light emitting semiconductor nanoparticles.

In an embodiment, a maximum luminescent peak wavelength of the semiconductor nanoparticles may be in a wavelength range of from ultraviolet light to infrared light. In an embodiment, a maximum luminescent peak wavelength of the semiconductor nanoparticles may be greater than or equal to about 300 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the semiconductor nanoparticle may be less than or equal to about 800 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm. The maximum luminescent peak wavelength of the semiconductor nanoparticle may be from about 500 nm to about 650 nm.

The semiconductor nanoparticle may emit green light (for example, on an application of a voltage or irradiation with light) and a maximum luminescent peak wavelength thereof may be in the range of greater than or equal to about 500 nm (for example, greater than or equal to about 510 nm, greater than or equal to about 515 nm) and less than or equal to about 560 nm, for example, less than or equal to about 540 nm, or less than or equal to about 530 nm. The semiconductor nanoparticle may emit red light, (for example, on an application of voltage or irradiation with light), and a maximum luminescent peak wavelength thereof may be in the range of greater than or equal to about 600 nm, for example, greater than or equal to about 610 nm and less than or equal to about 650 nm, or less than or equal to about 640 nm. The semiconductor nanoparticle(s) may emit blue light, (for example, on an application of voltage or irradiation with light) and a maximum luminescent peak wavelength thereof may be greater than or equal to about 430 nm (for example, greater than or equal to about 450 nm) and less than or equal to about 480 nm (for example, less than or equal to about 465 nm). White light may be implemented by combining them.

In an embodiment, the semiconductor nanoparticle may exhibit a luminescent spectrum (e.g., photo- or electroluminescent spectrum) with a relatively narrow full width at half maximum. In the photo- or electro-luminescent spectrum, the semiconductor nanoparticle(s) may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm. The full width at half maximum may be greater than or equal to about 12 nm, greater than or equal to about 20 nm, greater than or equal to about 25 nm, or greater than or equal to about 26 nm.

The semiconductor nanoparticle may exhibit (or may be configured to exhibit) a quantum efficiency (or quantum yield) of greater than or equal to about 10%, for example, greater than or equal to about 30%, greater than or equal to about 50%, greater than or equal to about 60%, greater than or equal to about 70%, greater than or equal to about 90%, or about 100%.

The semiconductor nanoparticle(s) may have a size (or an average size, hereinafter, can be simply referred to as "size") of greater than or equal to about 1 nm and less than or equal to about 100 nm. The size may be a diameter or equivalent diameter converted by assuming a spherical shape from an electron microscope image when not spherical. The size may be calculated from a result of an Inductively Coupled Plasma-Atomic Emission Spectroscopy (ICP-AES) analysis. In an embodiment, the semiconductor nanoparticle(s) may have a size of from about 1 nm to about 50 nm, for example, from about 2 nm (or about 3 nm) to about 35 nm. In an embodiment, a size (or an average size) of the semiconductor nanoparticle(s) may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm. In an embodiment, a size (or an average size) of the semiconductor nano-particle(s) may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm. As used herein, the average may be a mean average or a median average.

The shape of the semiconductor nanoparticle(s) or the semiconductor nanoparticle(s) is not particularly limited. For example, the shape of the semiconductor nanoparticle(s) may include, but is not limited to, a sphere, a polyhedron, a pyramid, a multi-pod shape, a hexahedron, a cube, a cuboid, a nanotube, a nanorod, a nanowire, a nanosheet, or a combination thereof. The nanoparticles can be, for example, substantially crystalline, substantially monocrystalline, polycrystalline, amorphous, or a combination thereof.

The semiconductor nanoparticle may be prepared in an appropriate method. The semiconductor nanoparticle may be prepared for example by a chemical wet method wherein a nanocrystal particle may grow by a reaction between precursors in a reaction system including an organic solvent and an organic ligand. The organic ligand or the organic solvent may coordinate a surface of the semiconductor nanocrystal to control the growth thereof.

In an embodiment, for example, the method of preparing the semiconductor nanoparticle(s) having a core/shell structure may include obtaining the core; reacting a first shell precursor including a metal (e.g., zinc) and a second shell precursor including a non-metal element (e.g., selenium, sulfur, or a combination thereof) in the presence of the core in a reaction system including an organic ligand and an organic solvent at a reaction temperature (e.g., of greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C.) to form a shell including a second semiconductor nanocrystal on a core including a first semiconductor nanocrystal. The method may further include separating a core from a reaction system producing the same and dispersing the core in an organic solvent to obtain a core solution.

In an embodiment, in order to form the shell, a solvent and optionally, the first shell precursor and a ligand compound may be heated at a predetermined temperature (e.g., greater than or equal to about 100° C.) under vacuum (or vacuum-treated) and then, after introducing an inert gas into the reaction vessel, the mixture may be heat-treated again at a predetermined temperature (e.g., greater than or equal to 100° C.). Then, the core and the second shell precursor may be added to the mixture and heated at a reaction temperature. The shell precursors may be added at different ratios during a reaction time simultaneously or sequentially.

In an embodiment, the core of the semiconductor nanoparticle may be prepared in an appropriate manner. The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g. trioctylphosphine oxide) substituted with a (e.g., 1, 2, or 3) C6 to C22 alkyl group, a C12 to C22 aromatic ether such as phenyl ether or benzyl ether, or a combination thereof. In an embodiment, after completing the reaction (for the formation of the core or for the formation of the shell), a nonsolvent is added to reaction products and nanoparticle(s) coordinated with the ligand compound may be separated from the reaction solution. The nonsolvent may be a polar solvent that is miscible with the solvent used in the core formation and/or shell formation reactions and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, or chromatography. The separated nanocrystals may be washed with a washing solvent, if needed. The washing solvent has no particular limit and may have a similar solubility parameter to that of the ligand and may, for example, include hexane, heptane, octane, chloroform, toluene, benzene, and the like.

In an embodiment, the semiconductor nanoparticles may be non-dispersible in water or water-insoluble, the aforementioned nonsolvent, or a combination thereof. The semiconductor nanoparticles of an embodiment may be dispersed in the aforementioned organic solvent. The aforementioned semiconductor nanoparticles may be dispersed in C6 to C40 aliphatic hydrocarbon, C6 to C40 substituted or unsubstituted aromatic hydrocarbon, or a combination thereof.

In the electroluminescent device 100, a thickness of the first light emitting layer 105a and the second light emitting layer 105b may be appropriately selected. In an embodiment, the first light emitting layer 105a and the second light emitting layer 105b may include a monolayer(s) of nanoparticles. In another embodiment, the light emitting layer may include one or more, for example, two or more, three or more, or four or more and 20 or less, 10 or less, 9 or less, 8 or less, 7 or less, or 6 or less monolayers of nanoparticles.

The first light emitting layer 105a and second light emitting layer 105b may have a thickness of greater than or equal to about 5 nm, for example, greater than or equal to about 10 nm, greater than or equal to about 20 nm, or greater than or equal to about 30 nm and less than or equal to about 200 nm, less than or equal to about for example, 150 nm, less than or equal to about 100 nm, less than or equal to about 90 nm, less than or equal to about 80 nm, less than or equal to about 70 nm, less than or equal to about 60 nm, or less than or equal to about 50 nm. The first light emitting layer 105a and second light emitting layer 105b may have a thickness of, for example about 10 nm to about 150 nm, for example about 20 nm to about 100 nm, for example about 30 nm to about 50 nm.

The forming of the first light emitting layer 105a and second light emitting layer 105b may be performed by obtaining a composition including nanoparticles (configured to emit desired light) and applying it on a substrate or charge auxiliary layer in an appropriate manner (e.g., by spin coating, inkjet printing, etc.) or by depositing.

In an embodiment, the first light emitting layer 105a and second light emitting layer 105b may be a single layer or a multi-layered structure having at least two layers.

In the multi-layered structure, adjacent layers (e.g., a first light emitting layer and a second light emitting layer) may be configured to emit a first light (e.g., green light, blue light, or red light). In the multi-layered structure, adjacent layers (e.g., a first light emitting layer and a second light emitting layer) may have the same or different composition and/or ligands.

In an embodiment, the (multi-layered) light emitting layer may exhibit a halogen content that varies (increases or decreases) in a thickness direction.

In an embodiment, in the (multi-layered) first light emitting layer 105a, the halogen content may increase toward the first electron auxiliary layer 103a, and in the (multi-layered) second light emitting layer 105b, the halogen content may increase toward the second electron auxiliary layer 103b. Also, in the (multi-layered) first light emitting layer 105a, a content of the organic ligand may decrease toward the first electron auxiliary layer 103a and in the (multi-layered) second light emitting layer 105b, a content of the organic ligand may decrease toward the second electron auxiliary layer 103b.

Alternatively, in the (multi-layered) first light emitting layer 105a, the halogen content may decrease toward the first electron auxiliary layer 103a and in the (multi-layered) second light emitting layer 105b, the halogen content may decrease toward the second electron auxiliary layer 103b. Also, in the (multi-layered) first light emitting layer 105a, a content of the organic ligand may increase toward the first electron auxiliary layer 103a and in the (multi-layered) second light emitting layer 105b, a content of the organic ligand may increase toward the second electron auxiliary layer 103b.

A conventional electron auxiliary layer formed by a vapor deposition method may act as an insulating layer when the thickness thereof is formed to be large. Unlike the conventional electron auxiliary layer, the electron auxiliary layer (the first electron auxiliary layer 103a and the second electron auxiliary layer 103b) of the electroluminescent device may include nanoparticles formed through a solution process. The electron auxiliary layer including these nanoparticles can be formed thicker than the electron auxiliary layer formed by the deposition method, so that it is easy to adjust the ratio ($t_1/t_0$) of the thickness ($t_1$) of the first electron auxiliary layer 103a to the thickness ($t_0$) of the transparent electrode and the ratio ($t_2/t_0$) of the thickness ($t_2$) of the second electronic auxiliary layer 130b to the thickness ($t_0$) of the transparent electrode to be in a desired range.

The first electronic auxiliary layer 103a and the second electronic auxiliary layer 103b may be formed by a solution process, and thus may exhibit a relatively high level of surface roughness. The first electron auxiliary layer 103a has a first surface in contact with the transparent electrode 101 and a second surface opposite to the first surface, and in the cross-sectional analysis of the electroluminescent device, the surface roughness of the second surface may be greater than or equal to about 3 nm, greater than or equal to about 5 nm, greater than or equal to about 7 nm, greater than or equal to about 10 nm, or greater than or equal to about 12 nm and less than or equal to about 100 nm, for example, less than or equal to about 50 nm. Similarly, the second electron auxiliary layer 103b has a first surface in contact with the transparent electrode 101 and a second surface opposite to the first surface, and in the cross-sectional analysis of the electroluminescent device, the surface roughness of the second surface may be greater than or equal to about 3 nm, greater than or equal to about 5 nm, greater than or equal to about 7 nm, greater than or equal to about 10 nm, or greater than or equal to about 12 nm and less than or equal to about 100 nm, for example, less than or equal to about 50 nm.

As described above, the first electron auxiliary layer 103a and the second electron auxiliary layer 103b may be formed through a solution process. The first electron auxiliary layer 103a and the second electron auxiliary layer 103b are formed by dispersing a plurality of zinc oxide nanoparticles in an organic solvent (e.g., a polar organic solvent, a non-polar organic solvent, or a combination thereof) to obtain a dispersion and coating the dispersion.

The dispersion may be coated on both surfaces of the transparent electrode 101. The solution process may further include removing (e.g., by evaporation, etc.) the organic solvent from the coated film. The method may include dispersing a plurality of zinc oxide nanoparticles in an organic solvent to obtain a dispersion and applying the dispersion to both sides of the transparent electrode 101; and optionally removing the organic solvent. The organic solvent may be a C1 to C10 alcohol solvent and is not particularly limited thereto.

The zinc oxide nanoparticle may be prepared in any proper method, which is not particularly limited. The zinc oxide (e.g., zinc magnesium oxide) nanoparticle may be prepared by placing a zinc compound (e.g., an organic zinc compound such as zinc acetate dihydrate) and an additional metal compound (e.g., an organic additional metal compound such as magnesium acetate tetrahydrate) in an organic solvent in a flask to have a desired mole ratio and heating the same at a predetermined temperature (e.g., from about 40° C. to about 120° C., or from about 60° C. to about 100° C.) (e.g., under atmosphere), and adding a precipitation accelerating solution (for example, an ethanol solution of tetramethyl ammonium hydroxide pentahydrate) at a predetermined rate with stirring. The prepared zinc oxide nanoparticles (e.g., $Zn_{1-x}M_xO$ nanoparticles, M is Mg, Ca, Zr, W, Li, Ti, Y, Al, or a combination thereof, and $0 \leq x \leq 0.5$) may be recovered from a resulting solution for example via centrifugation.

The first electron auxiliary layer 103a and the second electron auxiliary layer 103b may be electron transport layers and may have a two-layer structure including an electron injection layer and an electron transport layer.

A thickness of the electron injection layer may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, or greater than or equal to about 15 nm and less than or equal to about 20 nm, less than or equal to about 19 nm, less than or equal to about 18 nm, or less than or equal to about 17 nm, but is not limited thereto.

The first electrode 107a and the second electrode 107b are formed on the first light emitting layer 105a and the second light emitting layer 105b. The first electrode 107a and the second electrode 107b may function as an anode.

The first electrode 107a and the second electrode 107b may include hole injection conductors. The hole injecting conductor may be a metal, a metal-containing compound, an alloy, a metal oxide such as gallium indium oxide, indium tin oxide (ITO), or a conductive polymer (e.g., relatively high work function) such as polyethylenedioxythiophene, etc., but is not limited thereto. The metal may be silver, aluminum, magnesium, tungsten, nickel, cobalt, platinum, palladium, calcium, etc. and the metal-containing compound may be LiF or the like.

One of the first electrode 107a and the second electrode 107b may be a light transmitting electrode or a transparent electrode, and the other may be a non-light transmitting electrode.

The light transmitting electrode or transparent electrode may be made of a transparent conductive material such as indium tin oxide (ITO) or indium zinc oxide (IZO), gallium indium tin oxide, zinc indium tin oxide, titanium nitride, polyaniline, LiF/Mg:Ag, or the like or may be a thin single-layer or multi-layer metal thin film, but is not limited thereto.

The non-light transmitting electrode may be made of an opaque conductor such as silver (Ag), lithium aluminum (Li:Al) alloy, lithium fluoride-aluminum (LiF:Al), or the like.

Each thickness of the first electrode 107a and the second electrode 107b are not particularly limited and may be appropriately selected in consideration of device efficiency. For example, each of the first electrode 107a and the second electrode 107b may have a thickness of greater than or equal to about 10 nm, greater than or equal to about 20 nm, greater than or equal to about 30 nm, greater than or equal to about 40 nm, or greater than or equal to about 50 nm. For example, each of the first electrode 107a and the second electrode 107b may have a thickness of less than or equal to about 100 μm, for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

Figure 2:
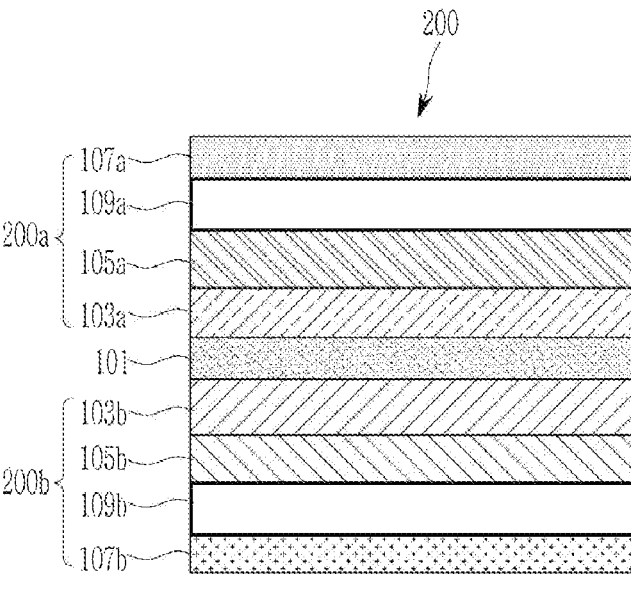
FIG. 2 is a schematic cross-sectional view of an electroluminescent device according to another embodiment.
Figure 2:
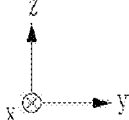

The electroluminescent device 100 may further include a hole auxiliary layer between the light emitting layer and the electrode. This structure is shown in FIG. 2. FIG. 2 is a schematic cross-sectional view of an electroluminescent device according to another embodiment.

Referring to FIG. 2, the electroluminescent device 200 includes a first unit device 200a including a first electron auxiliary layer 103a, a first light emitting layer 105a, a first hole auxiliary layer 109a, and a first electrode 107a disposed on one surface of a transparent electrode 101; and a second unit device 200b including a second electron auxiliary layer 103b, a second light emitting layer 105b, a second hole auxiliary layer 109b, and a second electrode 107b disposed on the other surface of the transparent electrode 101.

The transparent electrode 101, first electron auxiliary layer 103a, first light emitting layer 105a, first electrode 107a, second electron auxiliary layer 103b, second light emitting layer 105b, and second electrode 107b are the same as in FIG. 1.

The first hole auxiliary layer 109a and the second hole auxiliary layer 109b may include a hole injection layer or a hole transport layer, an electron blocking layer, or a combination thereof. The first hole auxiliary layer 109a and the second hole auxiliary layer 109b may each have a single component layer or a multi-layer structure in which adjacent layers include different components.

The HOMO energy levels of the first hole auxiliary layer 109a and the second hole auxiliary layer 109b may be matched with those of the first light emitting layer 105a and the second light emitting layer 105b in order to enhance mobility of holes transferred from the first hole auxiliary layer 109a and the second hole auxiliary layer 109b to the first light emitting layer 105a and the second light emitting layer 105b. The first hole auxiliary layer 109a may include a hole injection layer close to the first electrode 107a and a hole transport layer close to the first light emitting layer 105a. The second hole auxiliary layer 109b may include a hole injection layer close to the second electrode 107b and a hole transport layer close to the second light emitting layer 105b.

The material included in the first hole auxiliary layer 109a and the second hole auxiliary layer 109b (e.g., a hole transport layer, a hole injection layer, an electron blocking layer, or a combination thereof) is not particularly limited, and may include at least one selected from, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-Tris[phenyl (m-tolyl)amino]triphenylamine), 4,4',4"-tris(N-carbazolyl)-triphenylamine (TCTA), 1,1-bis[(di-4-toylamino) phenyl]cyclohexane (TAPC), a p-type metal oxide (e.g., NiO, WO₃, MoO₃, etc.), a carbon-based material such as graphene oxide, and a combinations thereof, but is not limited thereto.

Each thickness of the first hole auxiliary layer 109a and the second hole auxiliary layer 109b, or the thickness of each layer in the case of a multi-layered hole auxiliary layer may be appropriately selected. For example, each thickness of the first hole auxiliary layer 109a and the second hole auxiliary layer 109b, or the thickness of each layer in the case of a multi-layered hole auxiliary layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, for example, less than or equal to about 40 nm, less than or equal to about 35 nm, or less than or equal to about 30 nm, respectively, but is not limited thereto.

The electroluminescent device having the above structure may exhibit improved electroluminescent properties (external quantum efficiency, life-span, driving voltage).

The electroluminescent device may have a maximum external quantum efficiency (EQE) of greater than or equal to about 4%, greater than or equal to about 4.5%, greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%. The maximum external quantum efficiency (EQE) may be less than or equal to about 50%, less than or equal to about 40%, less than or equal to about 30%, or less than or equal to about 20%.

In an embodiment, a display device including the electroluminescent device described herein.

The display device may include a first pixel and a second pixel that is configured to emit light different from the first pixel. The first pixel, the second pixel, or a combination thereof may include the electroluminescent device of an embodiment. The display device may include a blue pixel, a red pixel, a green pixel, or a combination thereof. In the and heated at 60° C. in an air atmosphere. Subsequently, an ethanol solution of tetramethylammonium hydroxide pentahydrate is added into the reactor in a dropwise fashion at a speed of 3 milliliters per minute (mL/min). After stirring the mixture, the obtained $Zn_{1-x}Mg_xO$ nanoparticles are centrifuged and dispersed in ethanol to provide an ethanol dispersion of $Zn_{1-x}Mg_xO$ (x=0.15) nanoparticles.

The obtained nanoparticles are analyzed by transmission electron microscopic analysis, and the results show that the particles have an average particle size of about 3 nm.

Examples 1 to 3: Manufacture of Electrode Structure

Zinc magnesium oxide nanoparticles synthesized in a synthetic example are dispersed in ethanol to prepare dispersion.

The dispersion is spin-coated on a glass substrate (thickness: 1 mm) and heat-treated at 80° C. for 30 minutes to form a first electron auxiliary layer (thickness: 20 nm). Then, aluminum is deposited on the first electron auxiliary layer to form a transparent electrode having a thickness of 50 nm. The dispersion is spin-coated on the transparent electrode and heat-treated at 80° C. for 30 minutes to form a second electron auxiliary layer (thickness: 20 nm) to manufacture the electrode structure according to Example 1.

The electrode structures according to Example 2 and Comparative Example 1 are manufactured in the same method as Example 1, except that each thickness of the transparent electrode is changed to 100 nm and 150 nm, as shown in Table 1.

The transmittance is measured in the wavelength range of 100 to 1000 nm using UV-Vis spectroscopy (Cary series, Agilent Technologies). The results are recorded in Table 1.

TABLE 1

| | Thickness ($t_1$) of the first electron auxiliary layer | Thickness ($t_2$) of the second electron auxiliary layer | Thickness ($t_0$) of the transparent electrode | $t_1/t_0$ | $t_2/t_0$ | Transmittance (%) |
|---|---|---|---|---|---|---|
| Ex. 1 | 20 nm | 20 nm | 50 nm | 0.4 | 0.4 | $10^{-1}$ |
| Ex. 2 | 20 nm | 20 nm | 100 nm | 0.2 | 0.2 | $10^{-4}$ |
| Comp. Ex. 1 | 20 nm | 20 nm | 150 nm | 0.13 | 0.13 | $10^{-8}$ | display device, the red pixel may include a red light emitting layer including a plurality of red light emitting semiconductor nanoparticles, the green pixel may include a green light emitting layer including a plurality of green light emitting semiconductor nanoparticles, and the blue pixel may include a blue light emitting layer including a plurality of blue light emitting semiconductor nanoparticles.

The display device or an electronic apparatus may include (or may be) a television, a virtual reality/augmented reality (VR/AR), a handheld terminal, a monitor, a notebook computer, an electronic display board, a camera, or a part for an automatic, e.g., autonomous, vehicle.

Specific examples are described below. However, the examples described below are only for specifically illustrating or explaining the disclosure, and the scope of the disclosure is not limited thereto.

Synthesis Example: Synthesis of ZnMgO (ZMO) Nanoparticles

Zinc acetate dihydrate and magnesium acetate tetrahydrate are added into a reactor including dimethylsulfoxide Referring to Table 1, the transmittance of the electrode structure is more improved when the thickness ratio ($t_1/t_0$ and $t_2/t_0$) of the thickness of the first electronic auxiliary layer ($t_1$), the second electronic auxiliary layer ($t_2$), and the transparent electrode ($t_0$) is 0.2 and 0.4 (Examples 1 and 2) compared to 0.13 (Comparative Example 1). From the results, it is expected that devices including the electrode structures of Examples 1 and 2 improve the efficiency of the devices compared to the device including the electrode structure of Comparative Example 1.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

| | |
|---|---|
| 100, 200: electroluminescent device | 101: transparent electrode |
| 103a: first electron auxiliary layer | 105a: first light emitting layer |
| 107a: first electrode | 100a, 200a: first unit device |
| 103b: second electron auxiliary layer | 105b: second light emitting layer |
| 107b: second electrode | 100b, 200b: second unit device |

What is claimed is:

1. An electroluminescent device, comprising:

a first electron auxiliary layer, a first light emitting layer, and a first electrode disposed on a first surface of a transparent electrode; and a second electron auxiliary layer, a second light emitting layer, and a second electrode disposed on a second surface of the transparent electrode; where the second surface is opposed to the first surface;

wherein each of the first electron auxiliary layer and the second electron auxiliary layer comprise a plurality of zinc oxide nanoparticles, a ratio $(t_1/t_0)$ of a thickness $(t_1)$ of the first electron auxiliary layer to a thickness $(t_0)$ of the transparent electrode and a ratio $(t_2/t_0)$ of a thickness $(t_2)$ of the second electron auxiliary layer to the thickness $(t_0)$ of the transparent electrode are each in the range of about 0.1 to about 4, and each of the first light emitting layer and the second light emitting layer comprises a plurality of semiconductor nanoparticles.

2. The electroluminescent device of claim 1, wherein the transparent electrode has a transmittance of greater than or equal to about 90%.

3. The electroluminescent device of claim 1, wherein the transparent electrode is formed in a pattern and is formed in a direction orthogonal to the patterns of the first electrode and the second electrode.

4. The electroluminescent device of claim 1, wherein the zinc oxide nanoparticles further comprise an additional metal selected from Mg, Ca, Zr, W, Li, Ti, Y, Al, or a combination thereof.

5. The electroluminescent device of claim 1, wherein the zinc oxide nanoparticles have a formula $Zn_{1-x}M_xO$; wherein, M is Mg, Ca, Zr, W, Li, Ti, Y, Al, or a combination thereof, and $0 \leq x \leq 0.5$.

6. The electroluminescent device of claim 1, wherein an average size of the zinc oxide nanoparticles is about 1 nm to about 10 nm.

7. The electroluminescent device of claim 1, wherein a thickness of each of the first electron transport layer and the second electron transport layer is in a range of about 10 nm to about 90 nm.

8. The electroluminescent device of claim 1, wherein the first light emitting layer and the second light emitting layer comprise the same or different plurality of semiconductor nanoparticles.

9. The electroluminescent device of claim 1, wherein the plurality of semiconductor nanoparticles do not contain cadmium, lead, mercury, or a combination thereof.

10. The electroluminescent device of claim 1, wherein the plurality of semiconductor nanoparticles comprise a first semiconductor nanocrystal containing zinc, selenium, and tellurium, and a second semiconductor nanocrystal containing zinc chalcogenide; where the second semiconductor nanocrystal and is different from the first semiconductor nanocrystal.

11. The electroluminescent device of claim 1, wherein the plurality of semiconductor nanoparticles comprise a first semiconductor nanocrystal containing indium, phosphorus, and, optionally, zinc, and a second semiconductor nanocrystal containing zinc chalcogenide; where the second semiconductor nanocrystal is different from the first semiconductor nanocrystal.

12. The electroluminescent device of claim 1, wherein an average size of the plurality of semiconductor nanoparticles is about 4 nanometers to about 30 nanometers.

13. The electroluminescent device of claim 1, wherein the plurality of semiconductor nanoparticles comprise a core comprising the first semiconductor nanocrystal and a shell disposed on the core and comprising the second semiconductor nanocrystal.

14. The electroluminescent device of claim 1, wherein the first electron transport layer is adjacent to the first light emitting layer and the second electron transport layer is adjacent to the second light emitting layer.

15. The electroluminescent device of claim 1, wherein the electroluminescent device further comprises a first hole auxiliary layer between the first light emitting layer and the first electrode, and the electroluminescent device further comprise a second hole auxiliary layer between the second light emitting layer and the second electrode.

16. A method of manufacturing the electroluminescent device, comprising coating a dispersion containing zinc oxide nanoparticles on a first surface of a transparent electrode and then drying to form a first electron auxiliary layer, coating a composition containing semiconductor nanoparticles on the first electron auxiliary layer and then drying to form a first light emitting layer, coating a dispersion containing zinc oxide nanoparticles on a second surface of the transparent electrode and then drying to form a second electron auxiliary layer, and coating a composition containing semiconductor nanoparticles on the second electron auxiliary layer and then drying to form a second light emitting layer, where the first surface of the transparent electrode is opposed to the second surface; and forming a first electrode on the first light emitting layer and forming a second electrode on the second light emitting layer to manufacture of the electroluminescent device of claim 1.

17. A display device comprising the electroluminescent device of claim 1.

\* \* \* \* \*